(12) United States Patent
Morimoto

(10) Patent No.: US 6,875,675 B2
(45) Date of Patent: Apr. 5, 2005

(54) METHOD FOR MANUFACTURING A SEMICONDUCTOR FILM HAVING A PLANARIZED SURFACE

(75) Inventor: Yoshihiro Morimoto, Aichi (JP)

(73) Assignee: Sanyo Electric Co., Ltd. (JP)

( * ) Notice: Subject to any disclaimer, the term of this patent is extended or adjusted under 35 U.S.C. 154(b) by 0 days.

(21) Appl. No.: 10/186,354

(22) Filed: Jun. 28, 2002

(65) Prior Publication Data

US 2003/0015706 A1 Jan. 23, 2003

(30) Foreign Application Priority Data

Jun. 29, 2001 (JP) ........................................ 2001-198929

(51) Int. Cl.$^7$ ............................................... H01L 21/36
(52) U.S. Cl. ........................ 438/488; 438/482; 438/479
(58) Field of Search .............................. 438/149–166, 438/479–491

(56) References Cited

U.S. PATENT DOCUMENTS

| | | | |
|---|---|---|---|
| 4,772,566 A | * | 9/1988 | Zdebel et al. ............... 438/365 |
| 6,506,669 B1 | | 1/2003 | Kuramasu et al. |
| 6,534,353 B1 | | 3/2003 | Kuramasu et al. |
| 6,677,222 B1 | | 1/2004 | Mishima et al. |
| 2001/0003659 A1 | * | 6/2001 | Aya et al. ................... 438/166 |

FOREIGN PATENT DOCUMENTS

| | | |
|---|---|---|
| JP | 2000-294789 | 10/2000 |
| JP | 2000-357798 | 12/2000 |
| JP | 2001-60551 | 3/2001 |
| KR | 10-2001-039810 | 5/2001 |
| KR | 2001-0052812 | 6/2001 |
| WO | WO 00/01016 | 1/2000 |

OTHER PUBLICATIONS

First Notice of Grounds for Rejection of Chinese Patent Application No. 02125162.2 dated Jan. 2, 2004.
Notice to Submit Argument for Korean Patent Application No. 10–2002–0036629 dated Jun. 14, 2004.

* cited by examiner

Primary Examiner—Nathan J. Flynn
Assistant Examiner—Leonardo Andújar
(74) Attorney, Agent, or Firm—Cantor Colburn LLP

(57) ABSTRACT

An a-Si film formed on an insulating substrate is irradiated with a laser to obtain a p-Si film, which is then exposed to an oxidation atmosphere to form a surface oxide film. The surface oxide film is then removed to reduce the height of a projection generated on the surface of the p-Si film, thereby planarizing the surface of the p-Si film.

13 Claims, 5 Drawing Sheets

METHOD FOR MANUFACTURING A SEMICONDUCTOR FILM HAVING A PLANARIZED SURFACE

BACKGROUND OF THE INVENTION

1. Field of the Invention

The present invention relates to a semiconductor device and a method of manufacturing the same, and, more particularly, to a technique of planarizing a surface of a semiconductor film.

2. Description of the Related Art

Thin film transistors (hereinafter referred to as "TFTs") are manufactured in a related art as follows.

FIG. 1 illustrates the state of a surface of a polycrystallized silicon film, and FIGS. 2A–2D are cross sectional views illustrating steps of manufacturing a thin film transistor according to the related art taken along the line A—A in FIG. 1.

Step 1 (FIG. 2A): On an insulating substrate 10 formed of glass, quartz glass, or the like, an insulating film 11 of SiN and/or $SiO_2$ is formed through a CVD method. An amorphous silicon film (hereinafter referred to as an "a-Si film") 12 is formed on the film 11 through the CVD method.

Step 2 (FIG. 2B): The a-Si film 12 is irradiated with a XeCl, KrF, ArF, or similar linear excimer laser beam (beam of focused laser light) 14 scanning the film 12 from one end to the other for annealing, thereby melting and recrystallizing the a-Si film 12 for polycrystallization. As a result, a polycrystallized silicon film (hereinafter referred to as a "p-Si film") 313 is obtained.

During the above step, the surface of the a-Si film 12 is irradiated with the excimer laser beam 14 scanning in the direction of the arrow (leftward in the figure), thereby melting and recrystallizing the a-Si film 12. More specifically, the a-Si film 12 heated by irradiation of the laser beam 14 is allowed to cool and recrystallized, resulting in a p-Si film 313.

Step 3 (FIG. 2C): On the p-Si film 313, a gate insulating film 14 is formed of an $SiO_2$ film over the entire surface through a CVD method. A film of a refractory metal, such as chromium (Cr) and molybdenum (Mo), is formed by sputtering, and patterned to a predetermined shape through dry etching using photolithography and RIE (reactive ion etching) techniques, thereby producing a gate electrode 15.

When a P-channel TFT is formed, P-type ions, such as boron (B), are doped to the p-Si film 313 through the gate insulating film 14 using the gate electrode 15 as a mask. For an N-channel TFT, N-type ions, such as phosphorous (P), are doped. Consequently, the portion of the active layer, i.e. the p-Si film 313, covered with the gate electrode 15 serves as a channel region 313c, and the portions located on both sides thereof serve as a source region 313s and a drain region 313d.

Next, an interlayer insulating film 16 composed of a single $SiO_2$ film or two layers of $SiO_2$ film and SiN film is formed through the CVD method.

Step 4 (FIG. 2D): A first contact hole 17 penetrating the interlayer insulating film 16 and the gate insulating film 14 is formed at a position corresponding to the drain region 313d to reach the p-Si film 313, and a drain electrode 19 of a metal, such as aluminum, is formed in the first contact hole 17 portion. The drain electrode 19 is formed by, for example, depositing aluminum on the interlayer insulating film 16 having the thus-formed first contact hole 17 through sputtering, and patterning aluminum filled in the first contact hole 17.

For application in display devices, a planarization insulating film 20 is then provided on the interlayer insulating film 16 and the drain electrode 19 to planarize the surface. The planarization insulating film 20 formed by applying and baking a solution of an acrylic resin fills in concave portions produced by the gate electrode 15 and the drain electrode 19, contributing to surface planarization.

On the source region 313s, a second contact hole 21 penetrating the planarization insulating film 20, the interlayer insulating film 16, and the gate insulating film 14 is further formed. A display electrode 22 connected to the source 313s and spreading over the acrylic resin layer is formed in the portion where the second contact hole 21 is formed. The display electrode 22 is obtained by providing a transparent conductive film, such as an ITO (indium tin oxide) film, on the planarization insulating film 20 having the second contact hole 21 formed therein, applying a resist film on the transparent conductive film, processing the film to a predetermined electrode pattern, and etching the exposed transparent conductive film by a dry etching method, such as RIE, using HBr gas and $Cl_2$ as an etching gas.

However, in the TFT manufactured through polycrystallization according to the above-described manufacturing method of the related art, grain boundaries of crystals collide with one another when the a-Si film is melted and recrystallized by laser beam irradiation, and the a section where there is such a collision may rise to form a projection 300. As a result, the thickness of the gate insulating film 14 is reduced at a portion located on the projection 300 of the p-Si film 13. When the p-Si film 313 has a thickness of, for example, approximately 40 nm, the projection 300 also has a thick of approximately 40 nm. As a result, sufficient insulation between the p-Si film 313 and the gate electrode 15 cannot be ensured, or a short circuit is formed between the p-Si film 313 and the gate electrode 15 when the height of the projection 300 exceeds the thickness of the gate insulating film 14.

Further, an electric field is focused to the projection 300 by an applied voltage, thereby causing dielectric breakdown and, therefore, short-circuiting the p-Si film 313 and the gate electrode 15.

Still further, the voltage of the gate electrode 15 applied to the p-Si film 313 varies along the surface of the insulating substrate surface, producing TFTs with nonuniform characteristics. When such TFTs are used in a display device, such as a liquid crystal display device, there may be visible inconsistencies in the displayed images.

SUMMARY OF INVENTION

The present invention was conceived in view of the above-described problems, and aims to eliminate a projection at a surface of a semiconductor film.

According to one aspect, a semiconductor film of the present invention has a planarized surface achieved by oxidizing a surface of a semiconductor film having a projection on the surface and removing a formed surface oxide film.

According to another aspect of the present invention, the present invention provides a semiconductor film comprising a planarized surface achieved by irradiating an amorphous semiconductor film on a substrate with a laser beam for polycrystallization, performing oxidation on a surface of a polycrystallized semiconductor film, and removing a surface oxide film formed by the oxidation to reduce a height of a projection generated during the polycrystallization.

According to a further aspect of the present invention, in the above semiconductor film, said surface oxide film is a film formed by exposing said polycrystallized semiconductor film to a high pressure oxidation atmosphere.

According to a further aspect, the present invention provides a method of forming a semiconductor film in which a surface oxide film is formed by oxidizing a surface of a semiconductor film having a projection on the surface, and the surface oxide film is removed to planarize the surface of said semiconductor film.

According to a still further aspect, the present invention provides a method of forming a semiconductor film in which an amorphous semiconductor film is formed on a substrate, the amorphous semiconductor film is irradiated with a laser to change the amorphous semiconductor film into a polycrystalline semiconductor film, a surface of the polycrystalline semiconductor film is oxidized in a high pressure atmosphere, and the oxidized polycrystalline semiconductor film formed on the film surface is removed.

According to a further aspect, the present invention provides a method of manufacturing a semiconductor device in which an amorphous semiconductor film is formed on a substrate, the amorphous semiconductor film is irradiated with a laser to change the amorphous semiconductor film into a polycrystalline semiconductor film, a surface of the polycrystalline semiconductor film is oxidized in a high pressure oxidation atmosphere, the oxidized polycrystalline semiconductor film formed on the film surface is removed to expose said polycrystalline semiconductor film, an insulating film is formed covering said polycrystalline semiconductor film, and a gate electrode is formed on the insulating film.

According to a further aspect, the present invention provides a method of manufacturing a semiconductor device in which a gate electrode is formed on a substrate, a gate insulating film is formed covering the gate electrode, an amorphous semiconductor film is formed above the gate electrode, the amorphous semiconductor film is irradiated with a laser to change the amorphous semiconductor film into a polycrystalline semiconductor film, a surface of the polycrystalline semiconductor film is oxidized in a high pressure oxidation atmosphere, and the oxidized polycrystalline semiconductor film formed on the film surface is removed to expose the polycrystalline semiconductor film.

DESCRIPTION OF PREFERRED EMBODIMENTS

Preferred embodiments of the present invention will next be described with reference to the accompanying drawings. In the following, an example in which a method of manufacturing a semiconductor device according to the present invention is applied to a liquid crystal display device including TFTs will be described.

Figure 1:
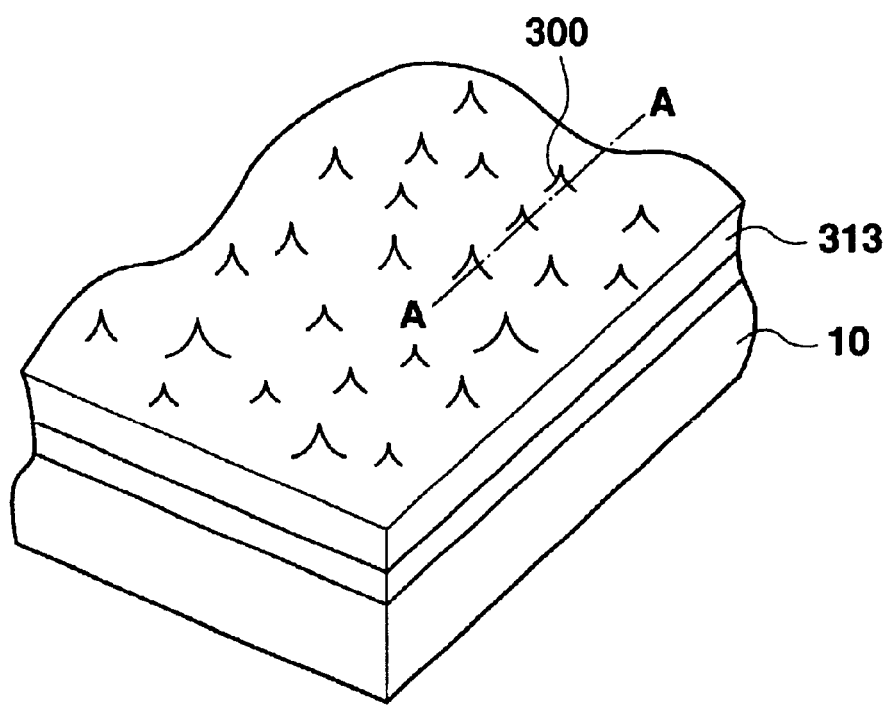
FIG. 1 is a perspective view illustrating a surface of a semiconductor film after laser irradiation.
Figure 2A:
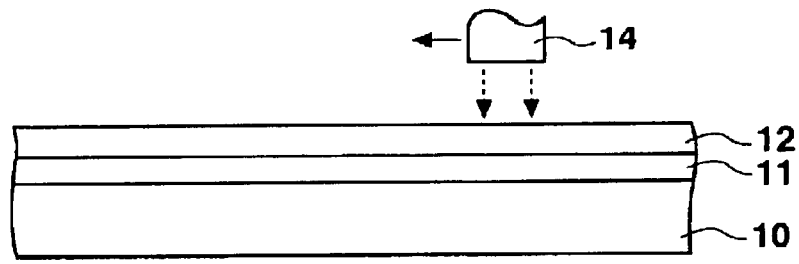
FIGS. 2A, 2B, 2C, and 2D are cross sectional views illustrating steps of manufacturing a semiconductor device according to a related art.
Figure 2B:
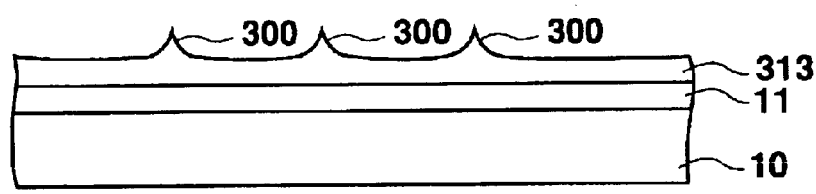
Figure 2C:
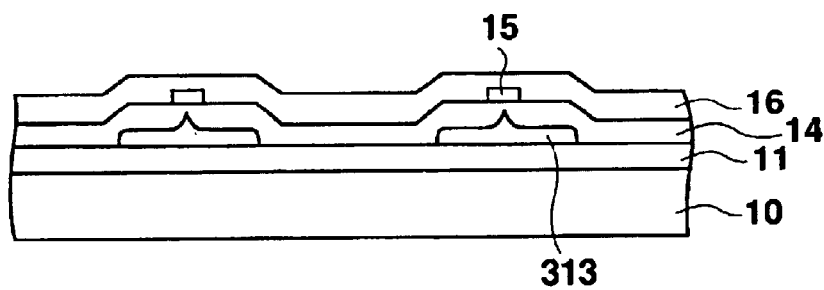
Figure 2D:
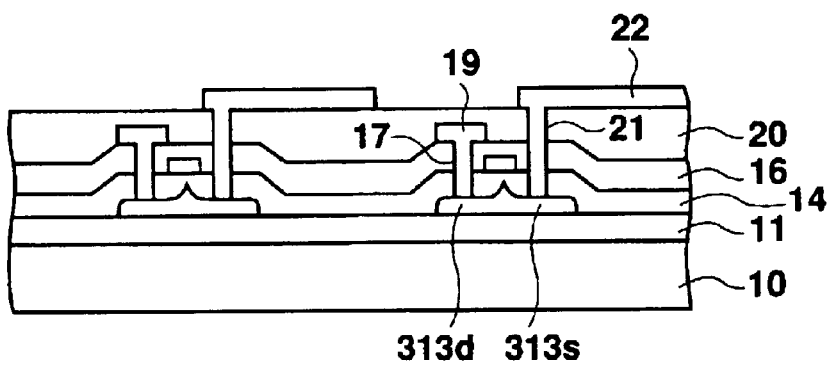
Figure 3A:
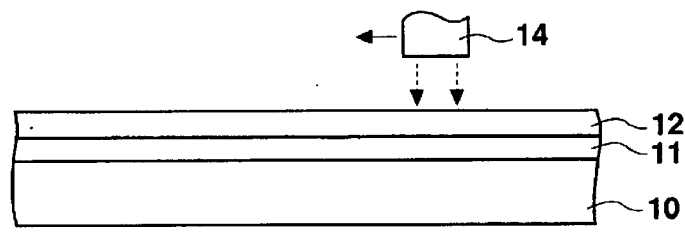
FIGS. 3A, 3B, 3C, 3D, and 3E are cross sectional views illustrating steps of manufacturing a semiconductor device according to the present invention.
Figure 3B:
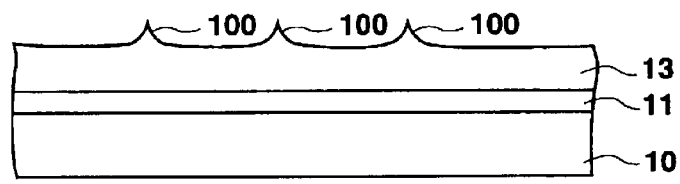
Figure 3C:
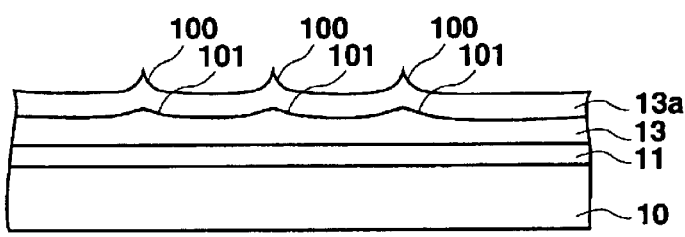
Figure 3D:
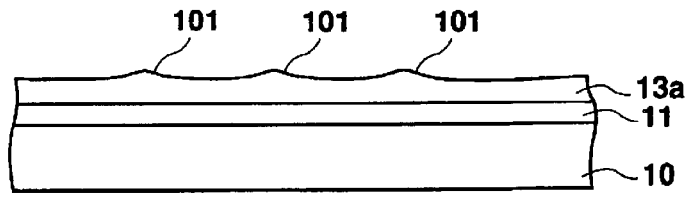
Figure 3E:
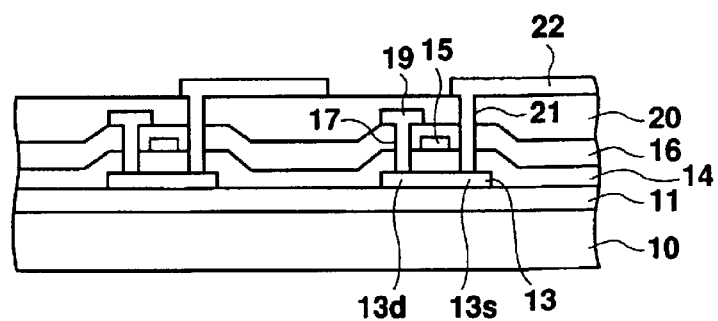
Figure 4:
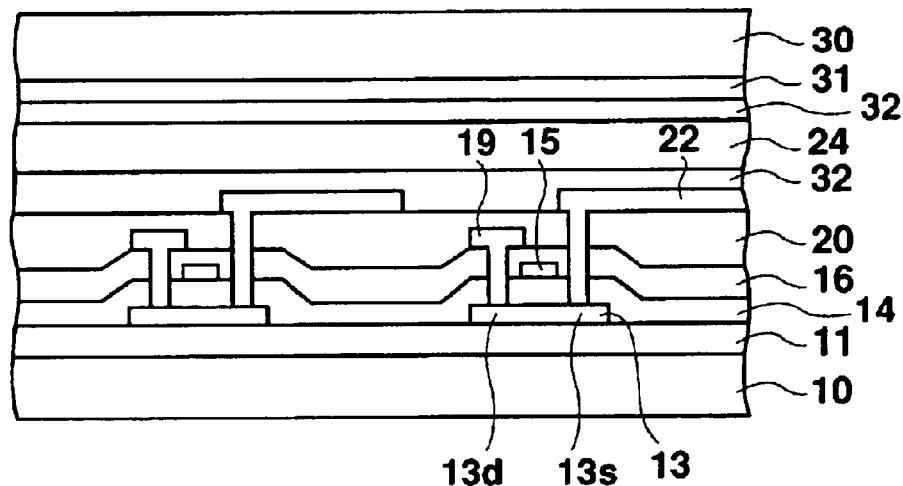
FIG. 4 is a cross sectional view illustrating a liquid crystal display device produced through a process employing the method of manufacturing a semiconductor device according to the present invention.

FIGS. 3A–3E are cross sectional views illustrating steps of manufacturing a TFT according to the present invention, and FIG. 4 is a cross sectional view illustrating a liquid crystal display device manufactured by the method of manufacturing a semiconductor device according to the present invention.

Step 1 (FIG. 3A): On an insulating substrate 10 formed of glass, quartz glass, or the like, an insulating film 11 composed of a single $SiO_2$ film or layered films including an SiN film and an $SiO_2$ film is formed by a CVD method or the like. Here, one aim is to prevent impurities, such as sodium (Na) ions, from entering from the insulating substrate 10 of glass to a semiconductor film (p-Si film) to be formed thereon. This is not always necessary when the substrate is formed of non-alkaline glass or the like which is not likely to cause entry of impurities.

The insulating substrate 10 according to the present invention also includes a substrate having insulating properties at the surface. In other words, the substrate may be formed by depositing on a semiconductor substrate an insulating film 11 of a single $SiO_2$ film or layered films including an SiN film and an $SiO_2$ film.

On the insulating film 11, an a-Si film 12 is formed by the CVD method. The thickness of the a-Si film 12 ranges from 30 nm to 100 nm, and is 55 nm in example of the present embodiment.

Step 2 (FIG. 3B): The a-Si film 12 is irradiated with a beam of linear excimer laser light with a wavelength of 308 nm scanning the film from one end to the other (toward the left in the figure) for annealing, thereby melting and recrystallizing the a-Si film 12 for polycrystallization to obtain a p-Si film 13.

During the above step, the a-Si film is melted and recrystallized by irradiating the surface of the a-Si film using the excimer laser. More specifically, the a-Si film heated by laser beam irradiation is melted and then allowed to cool, and recrystallized. During this process, grain boundaries of crystals collide with one another, and the collided portion rises to generate a projection 100.

For the laser, an XeCl excimer laser with the wavelength $\lambda$ of 308 nm described above or an ArF excimer laser with the wavelength $\lambda$ of 193 nm may be used.

Step 3 (FIG. 3C): The substrate 10 having the p-Si film 13 formed thereon is introduced into a high pressure oxidation device for oxidation under high pressure. The high pressure oxidation is performed under the conditions of, for example, the pressure of 200 megapascal (MPa), the in-device ambient temperature of 570° C., for 70 minutes.

As a result, a surface oxide film 13a composed of a silicon oxide film is formed on a surface of the p-Si film 13. The thickness of the surface oxide film is approximately 30 nm.

Because the p-Si film 13 is oxidized uniformly from its surface, the projection 100 having a surface area subjected to oxidation greater than that of the remaining flat portions is oxidized to a greater extent than the flat portions.

Step 4 (FIG. 3D) : After the surface of the p-Si film 13 is oxidized, the surface oxide film thereof is etched away using hydrogen fluoride (HF) to expose the p-Si film 13.

Thus, the projection 100 generated on the p-Si film 13 is removed, whereby the surface of the p-Si film 13 only has a small projection 101, and is substantially planarized.

Step 5 (FIG. 3E): On the p-Si film 13, a gate insulating film 14 of an $SiO_2$ film is formed over the entire surface by the CVD method. A film of a refractory metal, such as Cr and Mo, is formed by sputtering, and patterned to a predetermined shape by dry etching with photolithography and RIE techniques, thereby forming a gate electrode 15.

Using the gate electrode 15 as a mask, P-type or N-type ions are doped to the p-Si film 13 through the gate insulating film 14. More specifically, depending on the type of the TFT to be formed, P-type or N-type ions are doped to the portions of the p-Si film 13 that are not covered with the gate electrode 15.

For forming a P-channel TFT, P-type ions, such as boron (B), are doped, while N-type ions, such as phosphorous (P), are doped to form an N-channel TFT. As a result, the portion of the active layer, i.e. the p-Si film 13, that is covered with the gate electrode 15 functions as a channel region 13c, and the portions on both sides thereof function as a source region 13s and a drain region 13d.

Next, an interlayer insulating film 16 composed of a single $SiO_2$ film or two layers of an $SiO_2$ film and an SiN film is formed through CVD.

A first contact hole 17 penetrating the interlayer insulating film 16 is formed at a position corresponding to the drain region 13d to reach the p-Si film 13, and a drain electrode 19 of a metal, such as aluminum, is formed at a portion where the first contact hole 17 is provided. The drain electrode 19 may be formed by sputtering aluminum on the interlayer insulating film 16 where the first contact hole 17 is formed, and patterning aluminum filled in the first contact hole 17.

Next, a planarization insulating film 20 is formed on the interlayer insulating film 16 having the drain electrode 19 therein and the drain electrode 19 to planarize the surface. The planarization insulating film 20 is formed by applying and baking a solution of an acrylic resin to produce an acrylic resin layer, which can planarize the surface by filling in concave portions created by the gate electrode 15 and the drain electrode 19.

Further, above the source region 13s, a second contact hole 21 penetrating the planarization insulating film 20, the interlayer insulating film 16, and the gate insulating film 14 is formed, and, in this second contact hole 21 portion, a display electrode 22 connected to the source region 13s and spreading over the acrylic resin layer is formed. The display electrode 22 is formed as follows. A transparent conductive film of, for example, ITO is provided on the planarization insulating film 20 having the second contact hole 21 formed therein, and a resist film is applied on the transparent conductive film. After the film is processed to a predetermined electrode pattern, the transparent conductive film is etched by a dry etching method, such as the RIE method, using HBr gas and $Cl_2$ gas as an etching gas, completing the display electrode 22.

On the display electrode 22 and the planarization insulating film 20, an alignment film 32 for alignment of liquid crystal 24 is formed of a polyimide or $SiO_2$ film by a printing or spinner method.

This step completes the TFT substrate 10 provided on one side of a liquid crystal display device using a TFT for driving liquid crystal as a switching element.

Next, on an opposite electrode substrate 30, which is an insulating substrate formed of non-alkaline glass or the like, an opposite electrode 31 is formed of a transparent conductive film of ITO or the like over the entire surface of the substrate 30, followed by formation of the alignment film 32 of polyimide, $SiO_2$ or the like for alignment of the liquid crystal 24 on the electrode 31.

Thus, the opposite electrode substrate 30 is provided opposite to the above-described TFT substrate 10. These substrates 10 and 30 are bonded together by means of a sealing agent formed of an adhesive resin provided between, and in the vicinity of, the TFT substrate 10 and the opposite electrode substrate 30, and the liquid crystal 24 is filled between these substrates 10 and 30, which completes the liquid crystal display device as shown in FIG. 4.

Figure 5:
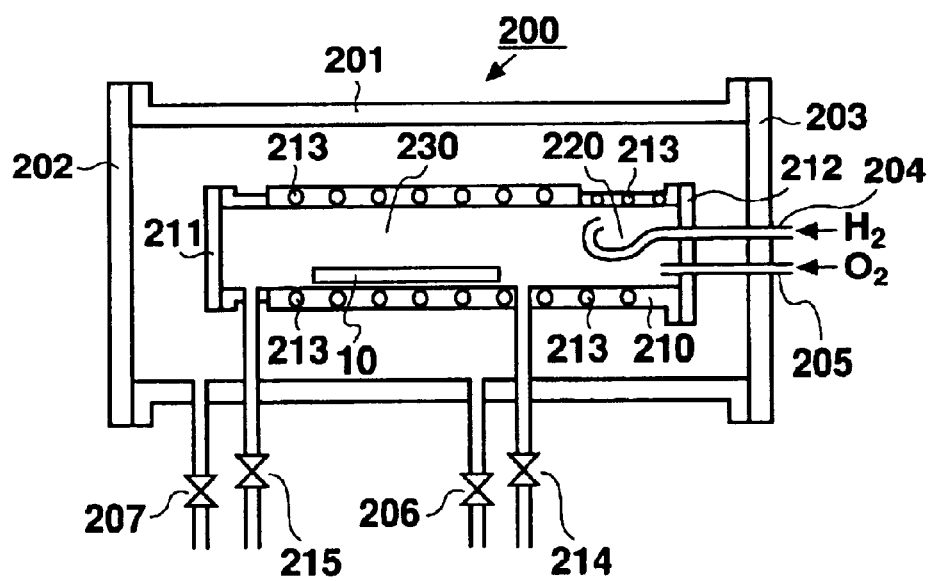
FIG. 5 is a cross sectional view illustrating a high pressure oxidation device used in the method of manufacturing a semiconductor device according to the present invention.

FIG. 5 is a cross sectional view illustrating a high pressure oxidation device.

A high pressure oxidation device 200 includes a pressure resistant container 201, and a reaction tube 210 provided therein.

The cylindrical pressure resistant container 201 formed of SUS is provided with lids 202 and 203 on both sides thereof for maintaining air tightness. The pressure resistant container lid 203 includes a hydrogen introduction port 204 and an oxygen introduction port 205.

The reaction tube 210 is of a cylindrical shape, and provided with reaction tube lids 211 and 212 for maintaining air tightness of the reaction tube 210. A heater 213 for heating the interior of the reaction tube 210 is provided around the reaction tube 210. Further, gas introduction tubes extend from the gas introduction ports 204 and 205 provided in the pressure resistant container lid 203 to the interior of the reaction tube 210.

The reaction tube 210 includes a combustion portion 220 where hydrogen and oxygen introduced from the hydrogen introduction port 204 and the oxygen introduction port 205, respectively, are mixed and combusted to release water vapor, and an oxide film forming portion 230 where a film undergoes oxidation caused by water vapor and heating. The insulating substrate 10 having the p-Si film 13 formed thereon is placed in the oxide film forming portion 230.

The pressure in the reaction tube 210 is elevated by a high pressure gas from a high pressure application valve 214, and the pressure in the pressure resistant container 201 is also high because of a high pressure gas introduced from a high pressure valve 206.

Operation of the high pressure oxidation device will next be described.

The lid 202 of the pressure resistant container 201, and then the reaction tube lid 211, are removed to introduce the insulating substrate 10 having the p-Si film 13 formed thereon into the oxide film forming portion 230. The reaction tube lid 211, and then the pressure resistant container lid 202, are replaced. The pressures inside the container 201 and the tube 210 are elevated by a high pressure gas introduced from the valves 206 and 214, respectively.

Hydrogen gas is introduced from the hydrogen introduction port 204 to the combustion portion 220 at a flow rate of approximately 3 liters/min, and simultaneously oxygen gas is introduced from the oxygen introduction port 205 to the combustion portion 220 at a flow rate of approximately 3 liters/min, thereby combusting these gases in the combustion portion 220 to generate water vapor. The generated water vapor produces a high pressure water vapor atmosphere in the reaction tube 210, thereby oxidizing a surface of the p-Si film 13 formed on the insulating substrate 10 introduced to the oxide film forming portion 230 to form an $SiO_2$ film, which is a surface oxide film.

The combustion portion 220 and the oxide film forming portion 230 in the reaction tube 210 are heated to approximately 570° C. by means of each heater 213.

After the surface oxide film 13a is formed on the surface of the p-Si film 13, valves 215 and 207 of the reaction tube 210 and the pressure resistant container 201, respectively, are opened to discharge high pressure water vapor. The pressure resistant container lid 202 and the reaction tube lid 211 are removed to take out the insulating substrate 10. The surface oxide film 13a formed on the surface of the p-Si film 13 provided on the insulating substrate 10 is then etched away with HF as described above. As a result, the p-Si film having a planarized surface is obtained after the surface oxide film 13a is removed.

It should be noted that, if the projection of the p-Si film serving as an active layer protrudes from the insulating film formed thereon, insulation cannot be obtained, and, moreover, a short circuit is made with the conductive layer formed on the insulating film. Therefore, even when a projection cannot be removed, it is desirable to reduce its height.

Figure 6:
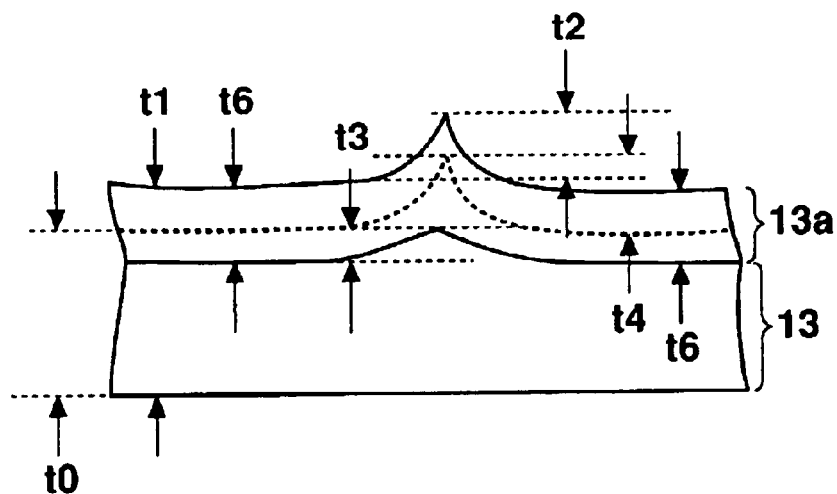
FIG. 6 is an enlarged cross sectional view illustrating a semiconductor film in a semiconductor device according to the present invention.

FIG. 6 is an enlarged cross sectional view illustrating the projection of the p-Si film subjected to high pressure oxidation, and the vicinity thereof. In FIG. 6, t0 denotes the thickness of the p-Si film 13 formed on the insulating substrate 10 prior to oxidation, t1 denotes the combined thickness of the p-Si film 13 and the oxide film 13a, t2 denotes the thickness (height) of a projection of the surface oxide film 13a, t3 denotes the thickness (height) of a projection of the p-Si film 13 after the oxide film is removed, t4 denotes the thickness (height) of a projection of the p-Si film, and t5 denotes the thickness of the oxide film formed on the surface of the p-Si film. The dotted line in the figure indicates the p-Si film before oxidation. In the present embodiment, t0 is 55 nm, t1 is 70 nm, t2 is 30 nm, t3 is 10 nm, t4 is 30 nm, and t5 is 30 nm.

As shown in this figure, the thickness (height) t3 of the projection 101 of the p-Si film after removing the surface oxide film formed by performing high pressure oxidation on the surface is significantly reduced as compared with the height t4 of the projection generated during formation of the p-Si film. In other words, the p-Si film having a planarized surface with reduced projections can be achieved after the surface oxide film is removed.

The projection of the p-Si film remaining after the surface oxide film is removed preferably has a thickness such that the insulating properties of the insulating film to be formed thereon can be substantially maintained, i.e. approximately 25 nm or smaller.

As described above, sufficient insulation can be ensured between the p-Si film 13 and the gate electrode 15 by forming the surface oxide film through high pressure oxidation and removing the surface oxide film with the oxidized projection on the surface of the p-Si film to planarize the p-Si film surface. Further, even when the height of the projection 100 exceeds the thickness of the gate insulating film 14, short circuiting between the p-Si film 13 and the gate electrode 15 can be prevented by removing the generated surface oxide film 13a to planarize the surface.

In addition, the electric field will not be focused to the projection 100 by the applied voltage.

Further, the voltage applied to the p-Si film 13 from the gate electrode 15 will not be varied in the insulating substrate surface, thereby preventing formation of TFTs with varying characteristics. Consequently, no variation is observed in the displayed screen when the TFTs are applied to a display device such as a liquid crystal display device.

Because the heating temperature during high pressure oxidation is lower than the withstanding temperature of 600° C. of the insulating substrate (such as a glass substrate) having the p-Si film formed thereon, use of a substrate resistant to a high temperature (such as a quartz substrate) is not required. In other words, a semiconductor device can be formed at a temperature of approximately 600° C. or lower through all manufacturing steps.

Figure 7:
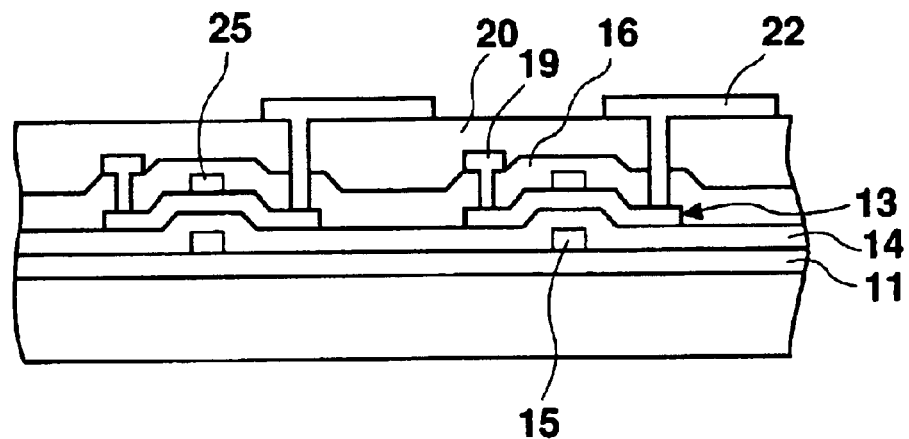
FIG. 7 is a view illustrating another configuration of the semiconductor device according to the present invention.

While in the above-described embodiment the present invention is applied to a so-called top gate type TFT in which a gate electrode is provided above a polycrystalline semiconductor film, the present invention is not limited to such an application. The invention is also applicable to a so-called bottom gate type TFT in which the gate electrode 15 is provided below the polycrystalline semiconductor film 13 as illustrated in FIG. 7, and the advantages of the present invention can also be enjoyed in such an application. In FIG. 7, the portions corresponding to those in, for example, FIG. 3E are labeled with the corresponding numerals. The configuration in FIG. 7 differs from that in FIG. 3E in the following respects. The gate electrode 15 and the gate insulating film 14 are formed prior to formation of the polycrystalline semiconductor film 13. The surface of the film 13 is oxidized, and then the resulting oxide film is removed. A stopper 25 for impurity implantation is formed in a channel formation region of the exposed polycrystalline semiconductor film 13. Using the stopper 25 as a mask, impurities are doped to the polycrystalline semiconductor film 13, thereby forming source and drain regions.

According to the present invention, projections generated on the surface of a p-Si film can be efficiently removed to achieve a planarized surface, whereby a semiconductor device with excellent characteristics can be obtained.

What is claimed is:

1. A method of forming a polycrystalline semiconductor film, wherein an amorphous semiconductor film is formed on a substrate, a withstanding temperature of the substrate is less than 600° C., the amorphous semiconductor film is irradiated with a laser to change the amorphous semiconductor film into a polycrystalline semiconductor film, a surface of the polycrystalline semiconductor film is oxidized in a high pressure atmosphere, and the oxidized polycrystalline semiconductor film formed on the film surface is removed to expose a planarized surface of said polycrystalline semiconductor film.

2. The method of forming a polycrystalline semiconductor film according to claim 1, wherein a buffer layer is formed on said substrate and said amorphous semiconductor film is formed on said buffer layer.

3. The method of forming a polycrystalline semiconductor film according to claim 1, wherein at least the polycrystallization of said semiconductor film by laser irradiation and oxidation of said semiconductor film are performed at a temperature of less than 600° C.

4. The method of forming a polycrystalline semiconductor film according to claim 1, wherein a surface of said polycrystalline semiconductor film having a projection is oxidized by oxidation in said high pressure oxidation atomsphere and said oxidized polycrystalline semiconductor film is removed to expose said polycrystalline semiconductor film with a planarized surface.

5. A method of manufacturing a semiconductor device, wherein an amorphous semiconductor film is formed on a substrate, a withstanding temperature of the substrate is less than 600° C., the amorphous semiconductor film is irradiated with a laser to change the amorphous semiconductor film into a polycrystalline semiconductor film, a surface of the polycrystalline semiconductor film is oxidized in a high pressure oxidation atmosphere, the oxidized polycrystalline semiconductor film formed on the film surface is removed to expose a planarized surface of said polycrystalline semiconductor film, an insulating film is formed covering said polycrystalline semiconductor film, and a gate electrode is formed on the insulating film.

6. The method of manufacturing a semiconductor device according to claim 5, wherein a buffer layer is formed on said substrate and said amorphous semiconductor film is formed on said buffer layer.

7. The method of manufacturing a semiconductor device according to claim 5, wherein at least the polycrystallization of said semiconductor film by laser irradiation and oxidation of said semiconductor film are performed at a temperature of less than 600° C.

8. The method of manufacturing a semiconductor device according to claim 5, wherein a surface of said polycrystalline semiconductor film having a projection is oxidized by oxidation in said high pressure oxidation atmosphere and said oxidized polycrystalline semiconductor film is removed to expose said polycrystalline semiconductor film with a planarized surface.

9. A method of manufacturing a semiconductor device, wherein a gate electrode is formed on a substrate, a withstanding temperature of the substrate is less than 600° C., a gate insulating film is formed covering the gate electrode, an amorphous semiconductor film is formed above the gate electrode, the amorphous semiconductor film is irradiated with a laser to change the amorphous semiconductor film into a polycrystalline semiconductor film, a surface of the polycrystalline semiconductor film is oxidized in a high pressure oxidation atmosphere, and the oxidized polycrystalline semiconductor film formed on the film surface is removed to expose a planarized surface of the polycrystalline semiconductor film.

10. The method of manufacturing a semiconductor device according to claim 9, wherein a buffer layer is formed on said substrate and said gate electrode is formed on said buffer layer.

11. The method of manufacturing a semiconductor device according to claim 9, wherein at least the polycrystallization of said semiconductor film by laser irradiation and oxidation of said semiconductor film are performed at a temperature of less than 600° C.

12. The method of manufacturing a semiconductor device according to claim 9, wherein a surface of said polycrystalline semiconductor film having a projection is oxidized by oxidation in said high pressure oxidation atmosphere and said oxidized polycrystalline semiconductor film is removed to expose said polycrystalline semiconductor film with a planarized surface.

13. A method of manufacturing a semiconductor device, wherein an amorphous semiconductor film is formed on a substrate, the amorphous semiconductor film is irradiated with a laser to change the amorphous semiconductor film into a polycrystalline semiconductor film, a surface of the polycrystalline semiconductor film is oxidized in a high pressure oxidation atmosphere, the oxidized polycrystalline semiconductor film formed on the film surface is removed to expose a planarized surface of said polycrystalline semiconductor film, an insulating film is formed covering said polycrystalline semiconductor film, and a gate electrode is formed on the insulating film, wherein all of the steps are performed at a temperature of less than 600° C.

* * * * *